United States Patent
Yamana et al.

(10) Patent No.: US 10,566,228 B2
(45) Date of Patent: Feb. 18, 2020

(54) HEATER FOR SEMICONDUCTOR MANUFACTURING APPARATUS

(71) Applicant: NGK INSULATORS, LTD., Nagoya (JP)

(72) Inventors: Keita Yamana, Nagoya (JP); Kazuhiro Nobori, Handa (JP); Kengo Torii, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 16/222,001

(22) Filed: Dec. 17, 2018

(65) Prior Publication Data
US 2019/0244847 A1   Aug. 8, 2019

Related U.S. Application Data

(63) Continuation of application No. PCT/JP2018/025003, filed on Jul. 2, 2018.

(30) Foreign Application Priority Data

Feb. 8, 2018 (JP) ................................. 2018-020637

(51) Int. Cl.
*H01L 21/683* (2006.01)
*C04B 35/645* (2006.01)
*C04B 35/581* (2006.01)

(52) U.S. Cl.
CPC ........ *H01L 21/6831* (2013.01); *C04B 35/581* (2013.01); *C04B 35/645* (2013.01); *C04B 2235/656* (2013.01)

(58) Field of Classification Search
CPC ............. H01L 21/6831; H01L 21/6833; H01L 21/68714; C04B 35/581; C04B 35/645; C04B 2235/656
See application file for complete search history.

(56) References Cited

U.S. PATENT DOCUMENTS 5,763,344 A   6/1998   Komatsu
2004/0171474 A1   9/2004   Kobayashi et al.
(Continued)

FOREIGN PATENT DOCUMENTS

| JP | H08-157261 A1 | 6/1996 |
| JP | H08-157262 A1 | 6/1996 |
| JP | H09-077558 A1 | 3/1997 |

(Continued)

OTHER PUBLICATIONS

Minoru Moriyama, et al., "Mechanical and Electrical Properties of Hot-Pressed TiN Ceramics without Additives," *Journal of the Ceramic Society of Japan*, vol. 99, No. 4, 1991, pp. 286-291 (with English translation).

(Continued)

*Primary Examiner* — Shawntina T Fuqua
(74) *Attorney, Agent, or Firm* — Burr & Brown, PLLC

(57) ABSTRACT

A heater for a semiconductor manufacturing apparatus, the heater includes an AlN ceramic substrate and a heating element embedded inside the AlN ceramic substrate. The AlN ceramic substrate contains O, C, Ti, Ca, and Y as impurity elements, includes an yttrium aluminate phase as a crystal phase, and has a Ti/Ca mass ratio of 0.13 or more, and a TiN phase is not detected in an XRD profile measured with Cu K-α radiation.

7 Claims, 5 Drawing Sheets

(56) References Cited

U.S. PATENT DOCUMENTS

| | | |
|---|---|---|
| 2005/0215415 A1 | 9/2005 | Hattori |
| 2008/0039312 A1* | 2/2008 | Natsuhara ............. C04B 35/581 |
| | | 501/153 |

FOREIGN PATENT DOCUMENTS

| | | |
|---|---|---|
| JP | 2004-203647 A1 | 7/2004 |
| JP | 2004-262750 A1 | 9/2004 |
| JP | 2005-281046 A1 | 10/2005 |
| JP | 2008-153194 A1 | 7/2008 |
| JP | 2018-16517 * | 2/2018 |
| JP | 2018-016517 A1 | 2/2018 |

OTHER PUBLICATIONS

Hiroshi Okimura, et al., "Evaluation of Electrical Conductivity Properties of Refractory Metal Compound Thin Films at Elevated Temperature," *The Transactions of the Institute of Electrical Engineers of Japan*, vol. 114-A, No. 12, 1994, pp. 886-891 (with English translation).

Japanese Office Action (Application No. 2018-020637) dated May 8, 2018.

International Search Report and Written Opinion (Application No. PCT/JP2018/025003) dated Aug. 21, 2018.

\* cited by examiner

HEATER FOR SEMICONDUCTOR MANUFACTURING APPARATUS

BACKGROUND OF THE INVENTION

1. Field of the Invention

The present invention relates to a heater for a semiconductor manufacturing apparatus.

2. Description of the Related Art

As a heater for a semiconductor manufacturing apparatus, a heater including an AlN ceramic substrate and a heating element embedded inside the AlN ceramic substrate is known, as described in PTL 1. This heater for a semiconductor manufacturing apparatus is used to heat a wafer placed on a surface of the AlN ceramic substrate. Another known example of the heater for a semiconductor manufacturing apparatus is a heater including a heating element and an electrostatic electrode embedded inside an AlN ceramic substrate, as described in PTL 2.

PTL 3 and PTL 4 disclose an AlN ceramic substrate obtained by sintering a mixture prepared by adding CaO, $TiO_2$, and the like to a raw material. For example, document 3 discloses an example in which 2 wt % CaO and 0.5 wt % $TiO_2$ are added to a raw material (Ti/Ca mass ratio: 0.21), and document 4 discloses an example in which 1 wt % CaO and 0.2 wt % $TiO_2$ are added to a raw material (Ti/Ca mass ratio: 0.15).

CITATION LIST

Patent Literature

PTL 1: JP 2008-153194 A
PTL 2: JP 2005-281046 A
PTL 3: JP 8-157261 A
PTL 4: JP 8-157262 A

SUMMARY OF THE INVENTION

In the heaters for semiconductor manufacturing apparatuses described in PTL 1 and PTL 2, leakage of an electric current from the heating element to the wafer or leakage of an electric current from the electrostatic electrode to the wafer cause damage to the wafer. Thus, the volume resistivity of the AlN ceramic substrate is preferably controlled to a high value (for example, $7 \times 10^8$ Ωcm or more). However, the volume resistivity of the AlN ceramic substrate may fluctuate due to the effects of impurities, and it has been difficult to control the volume resistivity. In particular, an AlN ceramic substrate sometimes contains, as impurity elements, O, C, Ti, Ca, and Y, and how these elements affect the volume resistivity has not been elucidated thus far.

The AlN ceramic substrates disclosed in PTL 3 and PTL 4 contain Ti and Ca; however, there is a problem in that due to a high Ti content, a TiN phase having a significantly low volume resistivity (2 to $6 \times 10^{-5}$ Ωcm) is generated during sintering and lowers the volume resistivity of the entire AlN ceramic substrate.

The present invention has been made to address this problem, and a main object thereof is to provide a heater for a semiconductor manufacturing apparatus, the heater including an AlN ceramic substrate, in which the heater exhibits a high volume resistivity at high temperatures although the AlN ceramic substrate contains O, C, Ti, Ca, and Y as impurity elements.

A heater for a semiconductor manufacturing apparatus according to the present invention includes:

an AlN ceramic substrate and a heating element embedded inside the AlN ceramic substrate, in which the AlN ceramic substrate contains O, C, Ti, Ca, and Y as impurity elements, includes an yttrium aluminate phase as a crystal phase, and has a Ti/Ca mass ratio of 0.13 or more, and a TiN phase is not detected in an XRD profile measured with Cu K-α radiation.

The heater for a semiconductor manufacturing apparatus has a high volume resistivity at high temperatures even when the AlN ceramic substrate used therein contains O, C, Ti, Ca, and Y as impurity elements. The reason behind this is presumably as follows. When Ca dissolves in an yttrium aluminate phase (for example, $Y_4Al_2O_9$ (YAM) or $YAlO_3$ (YAL)), divalent Ca substitutes trivalent Y; thus, oxygen deficiency is generated in relation to the valence balance, the number of oxygen ion-conducting paths is increased, and the volume resistivity is decreased. In contrast, when Ti dissolves in an yttrium aluminate phase, tetravalent Ti substitutes trivalent Al; thus, oxygen deficiency is compensated in relation to the valence balance, and the number of oxygen deficiency is decreased. Presumably, at a Ti/Ca mass ratio of 0.13 or more, Ti appropriately suppresses the increase in the number of oxygen ion-conducting paths caused by Ca, and thus the volume resistivity of the AlN ceramic substrate at high temperatures is increased.

An excessively large amount of Ti in the AlN ceramic substrate causes generation of TiN. TiN has a volume resistivity of 2 to $6 \times 10^{-5}$ Ωcm at room temperature, and the volume resistivity at 600° C. is about 1.1 times the volume resistivity at room temperature (document 1: Journal of the Ceramic Society of Japan, vol. 99, No. 4, pp 286-291 (1991), document 2: The Transactions of the Institute of Electrical Engineers of Japan. A, vol. 114, No. 12, pp 886-891 (1994)). In other words, TiN is a compound that has a significantly low volume resistivity at room temperature and high temperatures. Thus, in order for the AlN ceramic substrate to exhibit a high volume resistivity at high temperatures, a TiN phase is preferably not contained. If TiN is generated, breakdown is likely to occur and corrosion resistance is degraded; thus, from these viewpoints also, the AlN ceramic substrate preferably does not contain a TiN phase. The XRD profile of the TiN phase is indicated in JCPDS 38-1420. If no TiN phase is detected in the XRD profile of the AlN ceramic substrate, the decrease in volume resistivity caused by TiN is suppressed; thus, the volume resistivity of the AlN ceramic substrate at high temperatures can be increased, and breakdown and degradation of corrosion resistance caused by TiN can be suppressed. The XRD profile is measured with Cu K-α radiation (in detail, measurement is conducted with Cu K-α radiation at a tube voltage of 40 kV and a tube current of 40 mA).

It is possible that the TiN phase exists as a phase in which Al is dissolved in TiN; however, even in this case, the volume resistivity is significantly low, and breakdown and degradation of corrosion resistance may result.

The AlN ceramic substrate preferably has a Ti/Ca mass ratio of 0.13 or more and 0.5 or less. The AlN ceramic substrate preferably has a Ti content of 18 mass ppm or more and 95 mass ppm or less. The AlN ceramic substrate preferably contains YAM and YAL and, in such a case, preferably has an YAM/YAL mass ratio of 2.8 or more and 5.3 or less. The AlN ceramic substrate preferably has an O/C mass ratio of 48 or more and 65 or less.

The heater for a semiconductor manufacturing apparatus of the present invention can be prepared by, for example, preparing a molded body by molding a powder mixture of an AlN raw material powder containing O, C, Ti, and Ca as impurity elements and an $Y_2O_3$ powder serving as a sintering aid while having a heating element embedded inside, and then firing the resulting molded body. The AlN raw material powder preferably has an O/C mass ratio of 20 to 30 and a Ti/Ca mass ratio of 0.13 or more. In this manner, the AlN ceramic substrate after the AlN raw material powder is fired by using an $Y_2O_3$ powder as a sintering aid is likely to form the AlN ceramic substrate described above. This AlN raw material powder can be obtained by nitriding and oxidizing a powder prepared by adding appropriate amounts of C, $TIO_2$, and CaO to an $Al_2O_3$ powder containing O, C, Ti, and Ca as necessary. In the AlN raw material powder, the O content is preferably 0.70 to 0.75 mass %, the C content is preferably 220 to 380 mass ppm, the Ti content is preferably 18 to 95 mass ppm, and the Ca content is preferably 150 to 250 mass ppm.

In the heater for a semiconductor manufacturing apparatus of the present invention, the AlN ceramic substrate preferably has a volume resistivity of $1.0 \times 10^9$ Ωcm or more at 540° C. In this manner, leakage current from the heating element to the wafer to be placed on the AlN ceramic substrate can be sufficiently reduced.

In the heater for a semiconductor manufacturing apparatus of the present invention, the AlN ceramic substrate preferably has a flexural strength of 300 MPa or more, and more preferably 310 MPa or more. In this manner, the heater exhibits a sufficient strength required for a structural component used in a semiconductor manufacturing apparatus.

In the heater for a semiconductor manufacturing apparatus of the present invention, the AlN ceramic substrate preferably has a thermal conductivity of 170 W/m·K or more. In this manner, the heat uniformity of a wafer to be placed on the AlN ceramic substrate is increased.

DETAILED DESCRIPTION OF THE INVENTION

Figure 1:
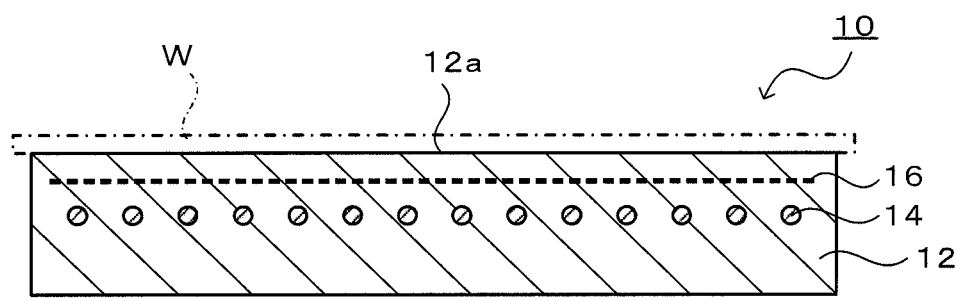
FIG. 1 is a schematic vertical sectional view illustrating a structure of an electrostatic chuck heater 10.

Preferable embodiments of the present invention will now be described with reference to the drawings. FIG. 1 is a schematic vertical sectional view illustrating a structure of an electrostatic chuck heater 10.

The electrostatic chuck heater 10 is an example of a heater for a semiconductor manufacturing apparatus of the present invention, and includes a ceramic substrate 12, a heating element 14, and an electrostatic electrode 16.

The ceramic substrate 12 is a disk component composed of AlN, and has a diameter of, for example, 200 to 450 mm. An upper surface of the ceramic substrate 12 constitutes a wafer receiving surface 12a on which a wafer W is to be placed. The ceramic substrate 12 is a substrate mainly composed of AlN but contains O, C, Ti, Ca, and Y as impurity elements, includes an yttrium aluminate phase as a crystal phase, and has a Ti/Ca mass ratio of 0.13 or more; and a TiN phase is not detected in an XRD profile measured. Whether or not the TiN phase is detected in an XRD profile is determined by collating the XRD profile of the ceramic substrate 12 with all peaks of the TiN phase. The ceramic substrate 12 preferably has a Ti/Ca mass ratio of 0.13 or more and 0.5 or less. The ceramic substrate 12 preferably has a Ti content of 18 mass ppm or more and 95 mass ppm or less. The ceramic substrate 12 preferably contains YAM and YAL as the yttrium aluminate phase and, in such a case, preferably has an YAM/YAL mass ratio of 2.8 or more and 5.3 or less. The ceramic substrate 12 preferably has an O/C mass ratio of 48 or more and 65 or less.

The heating element 14 is embedded inside the ceramic substrate 12. The heating element 14 is prepared by laying out a metal coil into a particular unicursal pattern throughout the entire wafer receiving surface 12a. The heating element 14 is not limited to a metal coil, and may have various shapes, for example, a ribbon shape, a mesh shape, and a sheet shape. The material for the heating element is preferably a high-melting conductive material, such as Mo, W, or Nb.

The electrostatic electrode 16 is embedded inside the ceramic substrate 12. The electrostatic electrode 16 is disposed between the wafer receiving surface 12a and the heating element 14. The shape of the electrostatic electrode 16 is not particularly limited, and may be, for example, a flat surface shape, a mesh shape, or a perforated metal. The material for the electrostatic electrode 16 is preferably a high-melting conductive material, such as Mo, W, or Nb.

Next, one example of the use of the electrostatic chuck heater 10 is described. First, the electrostatic chuck heater 10 is placed in a chamber not illustrated in the drawings. Then, a wafer W is placed on the wafer receiving surface 12a of the electrostatic chuck heater 10, and a voltage is applied to the electrostatic electrode 16 to generate an electrostatic attractive force, such as a Johnsen-Rahbek force, between the electrostatic electrode 16 and the wafer W so as to adsorb and fix the wafer W on the wafer receiving surface 12a. In addition, an external terminal is connected to the metal coil, which serves as the heating element 14, and a voltage is applied to cause the heating element 14 to generate heat so as to heat the wafer W to a particular temperature. Under this condition, various treatments necessary for manufacturing a semiconductor chip are performed on the wafer W. After completion of the treatments, voltage application to the electrostatic electrode 16 and to the heating element 14 is terminated, and the wafer W is unloaded from the wafer receiving surface 12a.

Next, an example of manufacturing the electrostatic chuck heater 10 is described. First, an AlN raw material powder containing O, C, Ti, and Ca as impurity elements is prepared. The AlN raw material powder preferably has an O/C mass ratio of 20 to 30 and a Ti/Ca mass ratio of 0.13 or more. This AlN raw material powder can be obtained by nitriding and oxidizing a powder prepared by adding appropriate amounts of C, $TiO_2$, and CaO to an $Al_2O_3$ powder containing O, C, Ti, and Ca as necessary. In the AlN raw material powder, the O content is preferably 0.70 to 0.75 mass %, the C content is preferably 220 to 380 mass ppm, the Ti content is preferably 18 to 95 mass ppm, and the Ca content is preferably 150 to 250 mass ppm.

Next, an $Y_2O_3$ powder that serves as a sintering aid is added to the thus-prepared AlN raw material powder to prepare a powder mixture, and the powder mixture is spray-dried to form granules. $Y_2O_3$ is added so that the concentration thereof is 4.5 to 5.5 mass % with respect to the entire powder mixture. The mixing method may be a wet-mixing method that uses an organic solvent or a dry mixing method that uses a ball mill, a vibrating mill, or the like, or a dry bag mixing method.

Subsequently, the granules of the powder mixture are molded while burying the heating element 14 and the electrostatic electrode 16 therein so as to prepare a molded body. The molded body is fired to form an AlN sintered body. As a result, the electrostatic chuck heater 10 is obtained. The firing method is not particularly limited, and, for example, hot press firing or the like may be employed. In performing the hot press firing, the maximum temperature (firing temperature) during firing is preferably set to 1700 to 1900° C., the amount of time the firing temperature is kept is preferably set to 0.5 to 100 hours, the pressing pressure is preferably set to 5 to 50 MPa, and the atmosphere is preferably a nitrogen atmosphere or a vacuum atmosphere (for example, 0.13 to 133.3 Pa).

According to the electrostatic chuck heater 10 of this embodiment described above, since the O/C mass ratio, the Ti/Ca mass ratio, and the YAM/YAL mass ratio are all within appropriate numerical ranges, the volume resistivity of the ceramic substrate 12 is increased, and the leakage current from the heating element 14 and the electrostatic electrode 16 to the wafer to be placed on the wafer receiving surface 12a of the ceramic substrate 12 can be reduced.

Note that the present invention is in no way limited by the above-described embodiments, and can naturally be implemented through various modifications without departing from the technical scope of the present invention.

For example, in the embodiments described above, an electrostatic chuck heater 10 is described as an example of the heater for a semiconductor manufacturing apparatus of the present invention; however, the electrostatic electrode 16 may be omitted, or the electrostatic electrode 16 may be replaced by an RF electrode.

EXAMPLES

Experimental Examples 1 to 11

For each Experimental Example, an AlN raw material powder indicated in Table 1 was prepared. The masses of the impurity elements contained in the AlN raw material powder were measured as follows. The mass analysis of the impurity elements was performed in accordance with JIS R 1675. Specifically, for quantifying oxygen, about 0.05 g of the sample was placed in an Ni capsule, which was then placed in a graphite crucible, and the sample therein was heated and burned to extract CO, which was detected with a non-dispersive infrared detector. For quantifying carbon, about 0.5 g of the sample was taken, a combustion aid (such as Sn) was added thereto, the resulting mixture was heated and burned, and generated $CO+CO_2$ was quantified with a non-dispersive infrared detector. For quantifying metal impurities, about 1 g of the sample was taken, particular amounts of nitric acid, hydrochloric acid, and hydrogen peroxide water were added thereto, the resulting mixture was heated to dissolve the sample, and the resulting solution was measured by ICP emission spectroscopy.

To the prepared AlN raw material powder, an $Y_2O_3$ powder that serves as a sintering aid was added, the resulting mixture was mixed in a ball mill to prepare a powder mixture, and the powder mixture was spray-dried to form granules. $Y_2O_3$ was added so that the concentration thereof was 5 mass % with respect to the entire powder mixture. Subsequently, a disk-shaped molded body was prepared by using the granules of the powder mixture. The molded body was hot-press fired to prepare an AlN sintered body. In performing the hot press firing, the maximum temperature (firing temperature) during firing was set to 1850 to 1890° C., the amount of time the firing temperature was kept was set to 2 hours, the pressing pressure was set to 20 MPa, and the atmosphere was a nitrogen atmosphere. The masses of the impurity elements contained in the obtained AlN sintered body, the mass of YAM, and the mass of YAL were measured.

Figure 2:
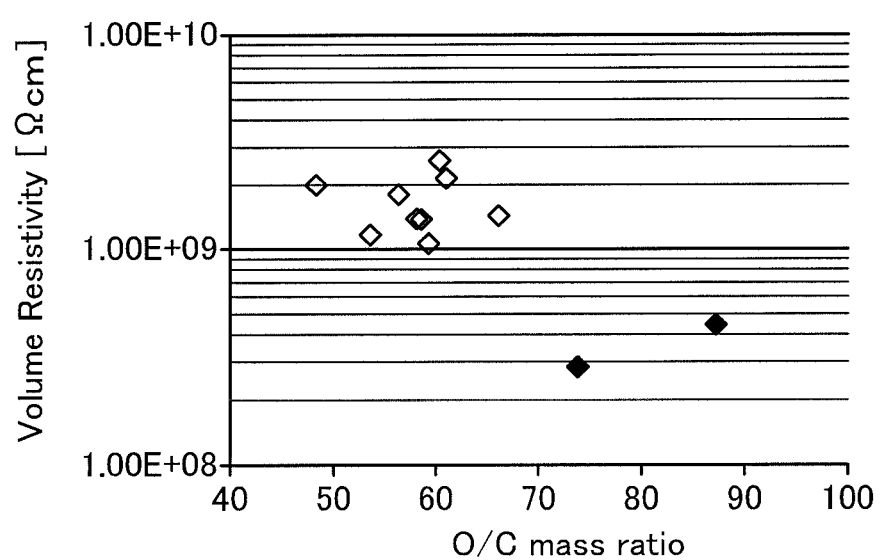
FIG. 2 is a graph illustrating the relationship between the O/C mass ratio and the volume resistivity.
Figure 3:
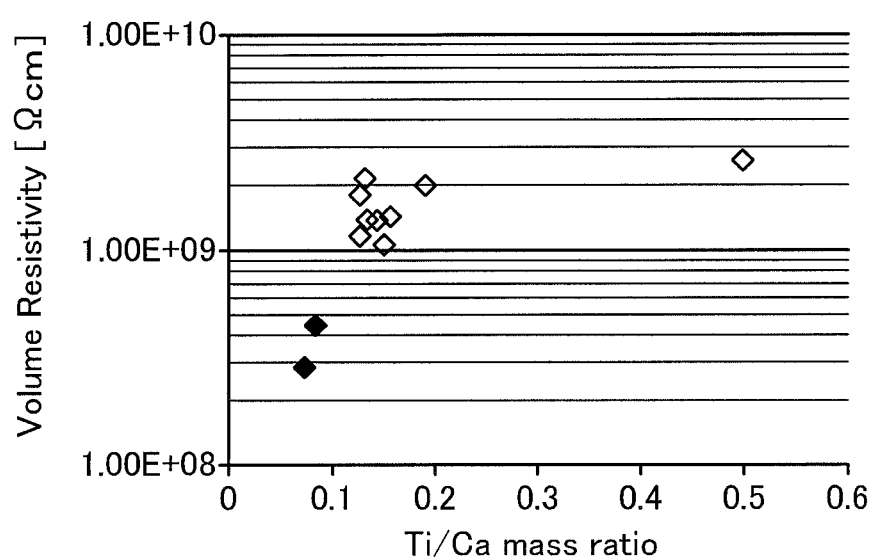
FIG. 3 is a graph illustrating the relationship between the Ti/Ca mass ratio and the volume resistivity.
Figure 4:
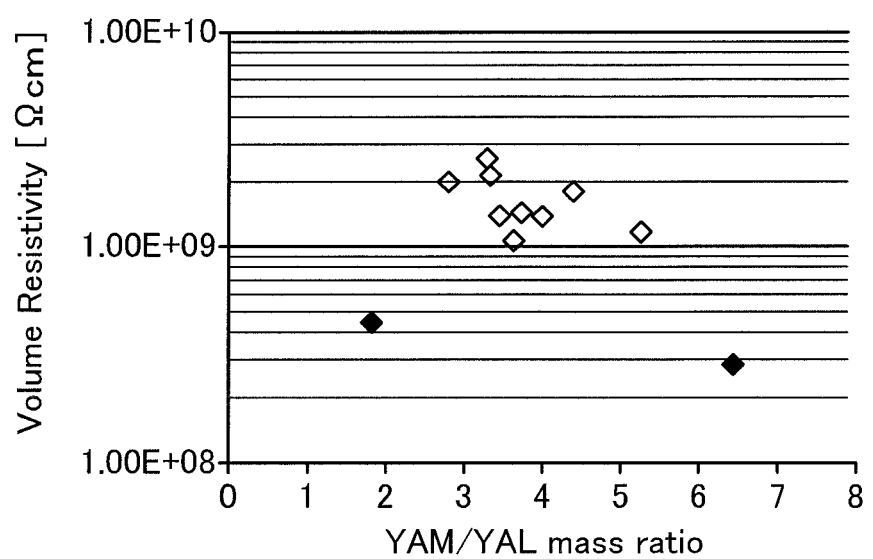
FIG. 4 is a graph illustrating the relationship between the YAM/YAL mass ratio and the volume resistivity.

The masses of the impurity elements in the AlN sintered body were measured by the same method as measuring the masses of the impurity elements in the AlN raw material powder. The masses of YAM and YAL were measured as follows. First, precision measurement was conducted by powder X-ray diffraction from 10 deg to 120 deg or more on the high angle side to obtain an XRD profile, the obtained XRD profile was used to identify crystal phases, and the identified crystal phases were presumed and subjected to a Rietveld analysis so as to calculate the quantitative value of each crystal phase. The volume resistivity of the AlN sintered body at 540° C. was measured as follows. A sample (50 mm×50 mm×1 mm) on which an electrode portion was printed with a Ag paste was heated to 540° C., and then, one minute after a voltage of 1 kV was applied, the current value was measured to determine the volume resistivity. The flexural strength was measured through a four-point bending test in accordance with JIS R 1601. The thermal conductivity was measured at room temperature through a laser flash method in accordance with JIS R 1611. The results are indicated in Table 2. The relationship between the O/C mass ratio and the volume resistivity is illustrated in FIG. 2, the relationship between the Ti/Ca mass ratio and the volume resistivity is illustrated in FIG. 3, and the relationship between the YAM/YAL mass ratio and the volume resistivity is illustrated in FIG. 4.

Figure 5:
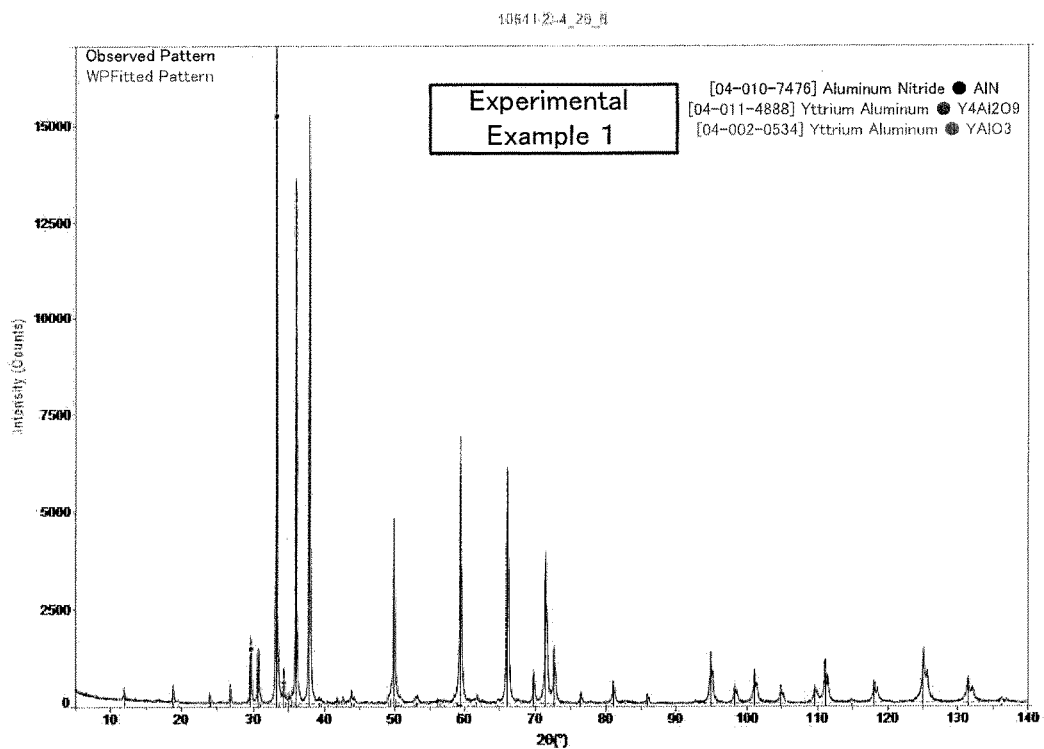
FIG. 5 is a graph illustrating an XRD profile of an AlN sintered body of Experimental Example 1.
Figure 6:
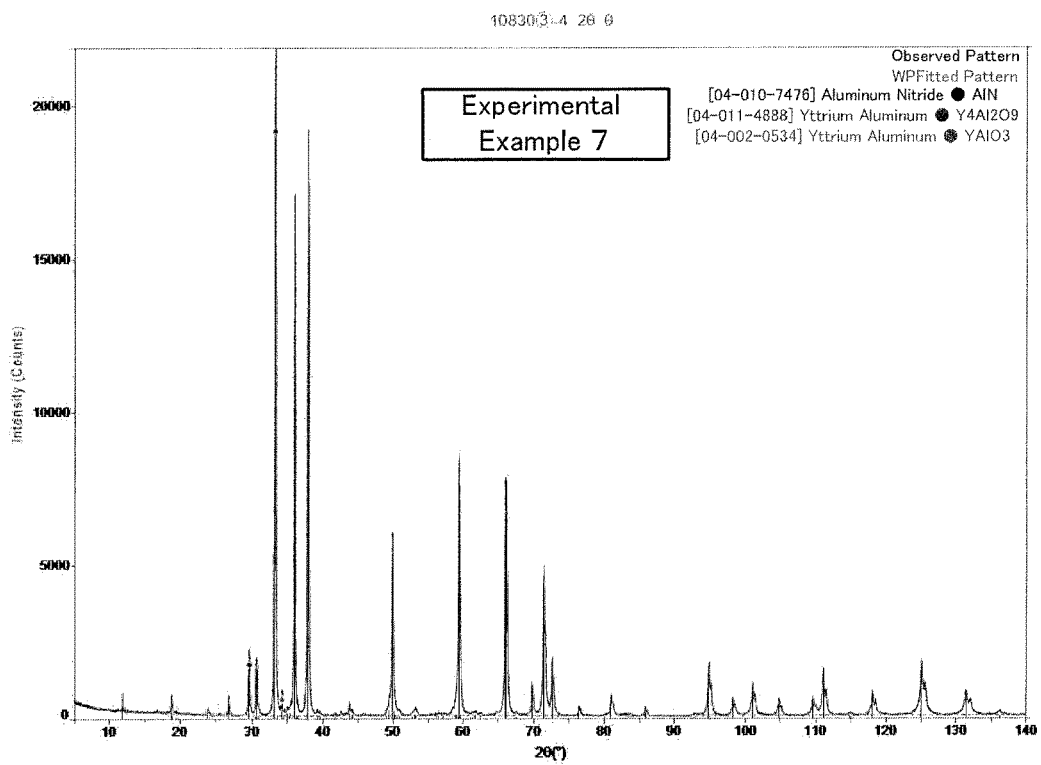
FIG. 6 is a graph illustrating an XRD profile of an AlN sintered body of Experimental Example 7.

In X-ray diffraction, about 0.5 g of the powder was measured with D8 ADVANCE produced by Bruker AXS. The measurement conditions were: Cu K-α radiation source, tube voltage of 40 kV, and tube current of 40 mA. The measurement results were subjected to a Rietveld analysis to identify and quantify the crystal phases. The results are indicated in FIGS. 5 and 6 and Table 2. FIGS. 5 and 6 are graphs illustrating XRD profiles of Experimental. Examples 1 and 7. The crystal phases identified from the XRD profiles of Experimental Examples 1 and 7 were AlN, YAM, and YAL, and no TiN was detected. For Experimental Examples 2 to 6, 8, and 9, presentation of XRD profiles is omitted, but similar results were obtained.

TABLE 1

| Experimental Example | AlN Raw Material Powder | | | | O/C mass ratio | Ti/Ca mass ratio |
|---|---|---|---|---|---|---|
| | Impurity Elements [mass %] | | | | | |
| | O | C | Ca | Ti | | |
| 1 | 0.75 | 0.031 | 0.014 | 0.0023 | 24.2 | 0.16 |
| 2 | 0.84 | 0.027 | 0.015 | 0.0018 | 31.1 | 0.12 |
| 3 | 0.70 | 0.031 | 0.014 | 0.0018 | 22.6 | 0.13 |

TABLE 1-continued

| Experimental | AlN Raw Material Powder | | | | | |
|---|---|---|---|---|---|---|
| | Impurity Elements [mass %] | | | | O/C | Ti/Ca |
| Example | O | C | Ca | Ti | mass ratio | mass ratio |
| 4 | 0.75 | 0.031 | 0.014 | 0.0023 | 24.2 | 0.16 |
| 5 | 0.84 | 0.027 | 0.015 | 0.0018 | 31.1 | 0.12 |
| 6 | 0.70 | 0.031 | 0.014 | 0.0018 | 22.6 | 0.13 |
| 7 | 0.72 | 0.028 | 0.016 | 0.0024 | 25.7 | 0.15 |
| 8 | 0.79 | 0.027 | 0.020 | 0.0100 | 29.3 | 0.50 |
| 9 | 0.72 | 0.028 | 0.016 | 0.0024 | 25.7 | 0.15 |
| 10 | 0.74 | 0.021 | 0.016 | 0.0012 | 35.2 | 0.08 |
| 11 | 0.69 | 0.025 | 0.016 | 0.0011 | 27.6 | 0.07 |

TABLE 2

| | AlN Sintered Body[X1] | | | | | | | | | | | |
|---|---|---|---|---|---|---|---|---|---|---|---|---|
| Experimental | Impurity Elements [mass %] | | | | YAM | YAL | O/C | Ti/Ca | YAM/YAL | Volume Resistivity | Flexural Strength | Thermal Conductivity |
| Example | O | C | Ca | Ti | [mass %] | [mass %] | mass ratio | mass ratio | mass ratio | [Ωcm] | [Mpa] | [W/m · K] |
| 1 | 1.80 | 0.031 | 0.014 | 0.0020 | 3.8 | 1.1 | 58.1 | 0.14 | 3.5 | 1.38E+09 | 321 | 170 |
| 2 | 1.77 | 0.029 | 0.016 | 0.0021 | 4.0 | 1.2 | 61.0 | 0.13 | 3.3 | 2.15E+09 | 346 | 170 |
| 3 | 1.69 | 0.030 | 0.015 | 0.0019 | 4.4 | 1.0 | 56.3 | 0.13 | 4.4 | 1.79E+09 | 313 | 180 |
| 4 | 1.78 | 0.030 | 0.014 | 0.0021 | 4.0 | 1.1 | 59.3 | 0.15 | 3.6 | 1.06E+09 | 333 | 170 |
| 5 | 1.70 | 0.029 | 0.015 | 0.0020 | 4.0 | 1.0 | 58.6 | 0.13 | 4.0 | 1.38E+09 | 333 | 170 |
| 6 | 1.66 | 0.031 | 0.015 | 0.0019 | 4.2 | 0.8 | 53.5 | 0.13 | 5.3 | 1.16E+09 | 325 | 180 |
| 7 | 1.72 | 0.026 | 0.016 | 0.0025 | 4.1 | 1.1 | 66.2 | 0.16 | 3.7 | 1.43E+09 | 315 | 180 |
| 8 | 1.57 | 0.026 | 0.02 | 0.0095 | 4.2 | 1.3 | 60.4 | 0.48 | 3.3 | 2.58E+09 | 357 | 170 |
| 9 | 1.11 | 0.023 | 0.0096 | 0.0018 | 2.5 | 0.9 | 48.3 | 0.19 | 2.8 | 1.99E+09 | 330 | 170 |
| 10 | 1.83 | 0.021 | 0.018 | 0.0015 | 4.0 | 2.2 | 87.1 | 0.08 | 1.8 | 4.45E+08 | 353 | 190 |
| 11 | 1.70 | 0.023 | 0.015 | 0.0011 | 4.5 | 0.7 | 73.9 | 0.07 | 6.4 | 2.83E+08 | 328 | 180 |

[X1]As firing condition, the maximum temperature (firing temperature) is 1850° C. (1890° C. in experimental example 9), the amount of time the firing temperature is kept is set to 2 hours, the pressing pressure is set to 20 MPa.

The AlN sintered bodies of Experimental Examples 1 to 9 contained O, C, Ti, Ca, and Y as impurity elements, included YAM and YAL as the crystal phase, and had a Ti/Ca mass ratio of 0.13 or more, and no TiN phase was detected in the XRD profiles. These AlN sintered bodies all had a volume resistivity as high as $1.0 \times 10^9$ (=1.0 E+09) [Ωcm] or more at 540° C. Thus, if the AlN sintered body is used in the ceramic substrate 12 of the electrostatic chuck heater 10 illustrated in FIG. 1, the leakage current from the heating element 14 and the electrostatic electrode 16 to the wafer W on the wafer receiving surface 12a can be reduced. The AlN sintered bodies of Experimental Examples 1 to 9 all had a Ti/Ca mass ratio of 0.13 or more and 0.5 or less, a Ti content of 18 mass ppm or more and 95 mass ppm or less, an YAM/YAL mass ratio of 2.8 or more and 5.3 or less, and an O/C mass ratio of 48 or more and 65 or less.

In contrast, the AlN sintered bodies of Experimental Examples 10 and 11 exhibited a volume resistivity as low as $4.5 \times 10^8$ [Ωcm] or less at 540° C. The cause for the decrease in volume resistivity in Experimental Examples 10 and 11 is presumably that the Ti/Ca mass ratio in particular was outside the appropriate range. That is, in Experimental Examples 10 and 11, presumably since the Ti/Ca mass ratios were as low as 0.08 and 0.07, respectively, the increase in the number of oxygen ion-conducting paths caused by dissolution of Ca in YAM and YAL overwhelmed the decrease in the number of oxygen ion-conducting paths caused by dissolution of Ti in YAM and YAL, resulting in the decreased volume resistivity. In Experimental Example 10, the Ti content was outside the appropriate range, the YAM/YAL mass ratio was outside the appropriate range, the O/C mass ratio was outside the appropriate range, and presumably these matters also caused the decrease in volume resistivity. In Experimental Example 11, the Ti content was outside the appropriate range and the O/C mass ratio was outside the appropriate range, and presumably these matters also caused the decrease in volume resistivity.

Furthermore, the AlN sintered bodies of Experimental Examples 10 and 11 had a flexural strength as high as 353 MPa and 328 MPa, respectively, but the AlN sintered bodies of Experimental Examples 1 to 9 also exhibited a flexural strength of 300 MPa or more (specifically, 310 MPa or more), which are comparable to Experimental Examples 10 and 11. Furthermore, the AlN sintered bodies of Experimental Examples 10 and 11 had thermal conductivities as high as 190 W/m·K and 180 W/m·K, respectively, but the AlN sintered bodies of Experimental Examples 1 to 9 also exhibited a thermal conductivity of 170 to 180 W/m·K, which are comparable to Experimental Examples 10 and 11.

Of the Experimental Examples 1 to 11 described above, Experimental Examples 1 to 9 correspond to examples of the present invention, and Experimental Examples 10 and 11 correspond to comparative examples. Note that the present invention is in no way limited by the above-described examples, and can naturally be implemented through various modifications without departing from the technical scope of the present invention.

The present application claims priority from Japanese Patent Application No. 2018-20637, file on Feb. 8, 2018, the entire contents of which are incorporated herein by reference.

What is claimed is:

1. A heater for a semiconductor manufacturing apparatus, the heater comprising:
   an AlN ceramic substrate and a heating element embedded inside the AlN ceramic substrate,
   wherein the AlN ceramic substrate contains O, C, Ti, Ca, and Y as impurity elements, includes an yttrium aluminate phase as a crystal phase, and has a Ti/Ca mass ratio of 0.13 or more, and a TiN phase is not detected in an XRD profile measured with Cu K-α radiation, and
   wherein the AlN ceramic substrate has a Ti content of 18 maspm or more and 95 mass ppm or less.

2. The heater for a semiconductor manufacturing apparatus according to claim 1,
   wherein the Ti/Ca mass ratio is 0.5 or less.

3. The heater for a semiconductor manufacturing apparatus according to claim 1,
wherein the AlN ceramic substrate contains YAM and YAL and has an YAM/YAL mass ratio of 2.8 or more and 5.3 or less.

4. The heater for a semiconductor manufacturing apparatus according to claim 1,
wherein an O/C mass ratio in the AlN ceramic substrate is 48 or more and 65 or less.

5. The heater for a semiconductor manufacturing apparatus according to claim 1,
wherein the AlN ceramic substrate has a volume resistivity of $1.0 \times 10^9$ Ωcm or more at 540° C.

6. The heater for a semiconductor manufacturing apparatus according to claim 1,
wherein the MN ceramic substrate has a flexural strength of 300 MPa or more.

7. The heater for a semiconductor manufacturing apparatus according to claim 1,
wherein the AlN ceramic substrate has a thermal conductivity of 170 W/m·K or more.

* * * * *